(12) United States Patent
Salmia et al.

(10) Patent No.: US 10,742,179 B2
(45) Date of Patent: Aug. 11, 2020

(54) POWER AMPLIFIER

(71) Applicant: Ingersoll-Rand Company, Davidson, NC (US)

(72) Inventors: Lauri Juhani Salmia, Espoo (FI); Petri J. Maki-Ontto, Espoo (FI); Risto Komulainen, Klaukkala (FI)

(73) Assignee: Ingersoll-Rand Industrial U.S., Inc., Davidson, NC (US)

( * ) Notice: Subject to any disclaimer, the term of this patent is extended or adjusted under 35 U.S.C. 154(b) by 343 days.

(21) Appl. No.: 15/909,539

(22) Filed: Mar. 1, 2018

(65) Prior Publication Data

US 2019/0273477 A1 Sep. 5, 2019

(51) Int. Cl.
| | |
|---|---|
| *H03F 1/30* | (2006.01) |
| *H03F 3/217* | (2006.01) |
| *H02K 7/09* | (2006.01) |
| *F16C 32/04* | (2006.01) |

(52) U.S. Cl.
CPC .......... *H03F 3/217* (2013.01); *F16C 32/0457* (2013.01); *H02K 7/09* (2013.01)

(58) Field of Classification Search
CPC ....................................................... H03F 1/30
USPC ................................................... 330/297, 51
See application file for complete search history.

(56) References Cited

U.S. PATENT DOCUMENTS

| | | | |
|---|---|---|---|
| 5,627,421 A | 5/1997 | Miller et al. | |
| 6,927,985 B2 | 8/2005 | Klinkowstein | |
| 7,321,224 B2 | 1/2008 | Iwamoto et al. | |
| 7,830,056 B2 * | 11/2010 | Barada | F16C 32/0448 310/90.5 |
| 8,451,638 B2 * | 5/2013 | Chapman | H02M 7/53873 363/56.01 |
| 2007/0188966 A1 | 8/2007 | Kawashima | |
| 2012/0038294 A1 | 2/2012 | Schulz et al. | |
| 2013/0222042 A1 * | 8/2013 | Kikuchi | H03K 17/04 327/374 |

(Continued)

FOREIGN PATENT DOCUMENTS

| | | |
|---|---|---|
| JP | 2010151235 A | 7/2010 |
| WO | 2015067309 A1 | 5/2015 |

OTHER PUBLICATIONS

International Search Report and Written Opinion, International Patent Application No. PCT/US2019/20324, dated Jun. 11, 2019, 7 pages.

*Primary Examiner* — Henry Choe
(74) *Attorney, Agent, or Firm* — Taft Stettinius & Hollister LLP

(57) ABSTRACT

Unique systems, methods, techniques and apparatuses of power amplifiers are disclosed. One exemplary embodiment is a power system for an active magnetic bearing including at least one power amplifier. Each power amplifier includes a first semiconductor device including a first node coupled to a neutral point node and a second node, a second output node coupled to the neutral point node, a second semiconductor device including a first node coupled to the second node of the first semiconductor device and a second node coupled to a first output node, a third semiconductor device including a first node coupled to a first DC bus node and a second node coupled to the first output node, and a fourth semiconductor device including a first node coupled to a second DC bus node and a second node coupled to the second node of the first semiconductor device.

20 Claims, 3 Drawing Sheets

(56) References Cited

U.S. PATENT DOCUMENTS

| | | | |
|---|---|---|---|
| 2014/0177305 A1* | 6/2014 | Irish | H02M 7/217 |
| | | | 363/127 |
| 2014/0226369 A1* | 8/2014 | Kimura | H02M 3/3376 |
| | | | 363/21.09 |
| 2015/0068243 A1 | 3/2015 | Kshiragar et al. | |
| 2017/0307013 A1 | 10/2017 | Salmia et al. | |

* cited by examiner

POWER AMPLIFIER

BACKGROUND

The present disclosure relates generally to power amplifiers. Certain industrial applications, including power systems for active magnetic bearings, require a power amplifier to control an output current. Existing power amplifiers suffer from a number of shortcomings and disadvantages. There remain unmet needs including reducing power losses, reducing output voltage ripple, reducing output current ripple, and reducing eddy currents in inductive loads coupled to power amplifiers. For instance, existing H-bridge based power amplifiers coupled to inductive loads operate switches with a 50% duty cycle, generating a significant AC component in the output voltage and output current. Ripple in the output voltage and current of the power amplifier cause eddy currents in loads that generate magnetic flux, such as iron-based inductive loads, which in turn cause power losses and excessive heat dissipation. There is a significant need for the unique apparatuses, methods, systems and techniques disclosed herein.

SUMMARY

Exemplary embodiments include unique systems, methods, techniques and apparatuses for power amplifiers. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
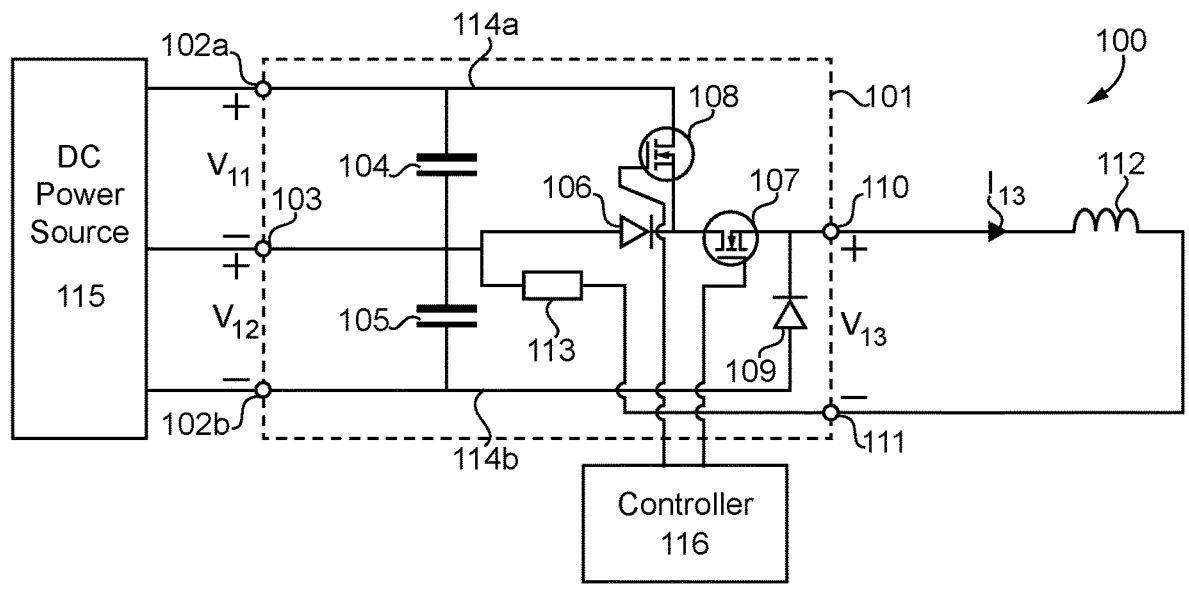
FIG. 1 illustrates an exemplary power amplifier.

With reference to FIG. 1, there is illustrated an exemplary active magnetic bearing (AMB) power system 100 including an exemplary power amplifier 101 coupled to a DC power source 115 and an AMB winding 112. It shall be appreciated that power system 100 may be implemented in a variety of applications, including air compressors, flywheels, turbines, and pumping systems, to name but a few examples.

DC power source 115 includes a positive pole and a negative pole coupled to power amplifier 101, and is structured to output DC power to power amplifier 101. In certain embodiments, the magnitudes of the voltage of the positive pole and the negative pole is substantially equal. In the illustrated embodiment, DC power source 115 includes a neutral point output node coupled to power amplifier 101. DC power source 115 may be a DC power generation device, DC power storage device, a DC distribution network, or an AC power source coupled to an AC-DC power converter.

AMB winding 112 is coupled between output nodes 110 and 111. AMB winding 112 is structured to receive a current $I_{13}$ from power amplifier 101 as current flows from node 110 to node 111. In other embodiments, AMB winding 112 may be replaced by another type of inductive load, such as an electric machine winding, a capacitive load, or a resistive load, to name but a few examples. The voltage of the power output by power amplifier 101 between nodes 110 and 111 is output voltage $V_{13}$.

Power amplifier 101 includes a positive DC bus node 102a, a neutral point node 103, and a negative DC bus node 102b. Positive DC bus node 102a is structured to be coupled to the positive pole of DC power source 115. Negative DC bus node 102b is structured to be coupled to the negative pole of DC power source 115. In certain embodiments such as the illustrated embodiment, neutral point node 103 may he coupled to a neutral point output node of DC power source 115.

A positive DC bus rail 114a is coupled to positive DC bus node 102a and structured to receive DC power with a positive voltage from DC power source 115. A negative DC bus rail 114b is coupled to negative DC bus node 102b and structured to receive DC power with a negative voltage from DC power source 115.

A capacitor 104 is coupled between positive DC bus node 102a and neutral point node 103, and a capacitor 105 is coupled between neutral point node 103 and negative DC bus node 102b. Capacitors 104 and 105 are structured to reduce ripple in the DC power output by DC power source 115. In certain embodiments, the voltage $V_{11}$ across capacitor 104 and the voltage $V_{12}$ across capacitor 105 are each one half the voltage across DC bus rails 114a and 114b. In other embodiments, power amplifier 101 does not include capacitors 104 and 105. In other embodiments, capacitors 104 and 105 may each be replaced by a plurality of capacitors or another type of device structured to reduce voltage ripple or current ripple.

Power amplifier 101 includes two semiconductor switches 107 and 108, and two diodes 106 and 109. In other embodiments, diodes 106 and 109 may be replaced with semiconductor switches or another type of device structured to allow unidirectional current flow.

Semiconductor switches 107 and 108 operate in a conductive state, also known as being turned on or closed, and a non-conductive state, also known as being turned off or open. Switches 107 and 109 are operated so as to selectively allow current flow through the semiconductor switch. Semiconductor switches 107 and 108 are turned on and turned off by an activation signal generated by controller 116. Semiconductor switches 107 and 108 may include freewheeling diodes, insulated gate bipolar transistors (IGBTs), bipolar junction transistors (BJTs), metal oxide semiconductor field effect transistors (MOSFETs), gate turn-off thyristors (GTOs), MOS-controlled thyristors (MCTs), integrated gate-commutated thyristors (IGCTs), silicon carbide (SiC) switching devices, gallium nitride (GaN) switching devices, or any other type of switch structured to selectively control the flow of electric current.

Diode 106 and semiconductor switch 107 are coupled in series between neutral point node 103 and output node 110. Diode 106 is structured to allow current to flow from neutral point node 103 to output node 110, but block current flowing in the opposite direction. Diode 106 includes a first node coupled to neutral point node 103 and a second node coupled to a first node of semiconductor switch 107. Semiconductor switch 107 also includes a second node coupled to output node 110.

Semiconductor switch 108 includes a first node coupled to positive DC bus node 102a by way of DC bus rail 114a, and a second node coupled to the second node of diode 106 and the first node of semiconductor switch 107. Diode 109 includes a first node coupled to output node 110 and a second node coupled to negative DC bus node 102b by way of negative DC bus rail 114b. Diode 109 is structured to allow current to flow from negative DC bus node 102b to output node 110, but block current from flowing in the opposite direction.

Neutral point node 103 is coupled to output node 111. In the illustrated embodiment, a sensor 113 is operatively coupled between neutral point node 103 and output node 111. Sensor 113 is structured to measure electrical characteristics and transmit measurements to controller 116. For example, sensor 113 may measure load current $I_{13}$ by measuring the current flowing between neutral point node 103 and output node 111. Sensor 113 may be a shunt resistor-based measuring device or another type of device structured to measure electrical characteristics. In other embodiments, sensor 113 is located between neutral point node 103 and the first terminal of diode 106.

Controller 116 is structured to operate the semiconductor switches of power amplifier 101 so as to control output current $I_{13}$ to winding 112. Beginning where semiconductor switch 107 is closed and 108 is open, controller 116 may increase the magnitude of current $I_{13}$ by closing switch 108 or may decrease the magnitude of current $I_{13}$ by opening switch 107, as explained in more detail below. It shall be appreciated that any or all of the foregoing features of system 100 may also be present in the other power systems disclosed herein.

Figure 2:
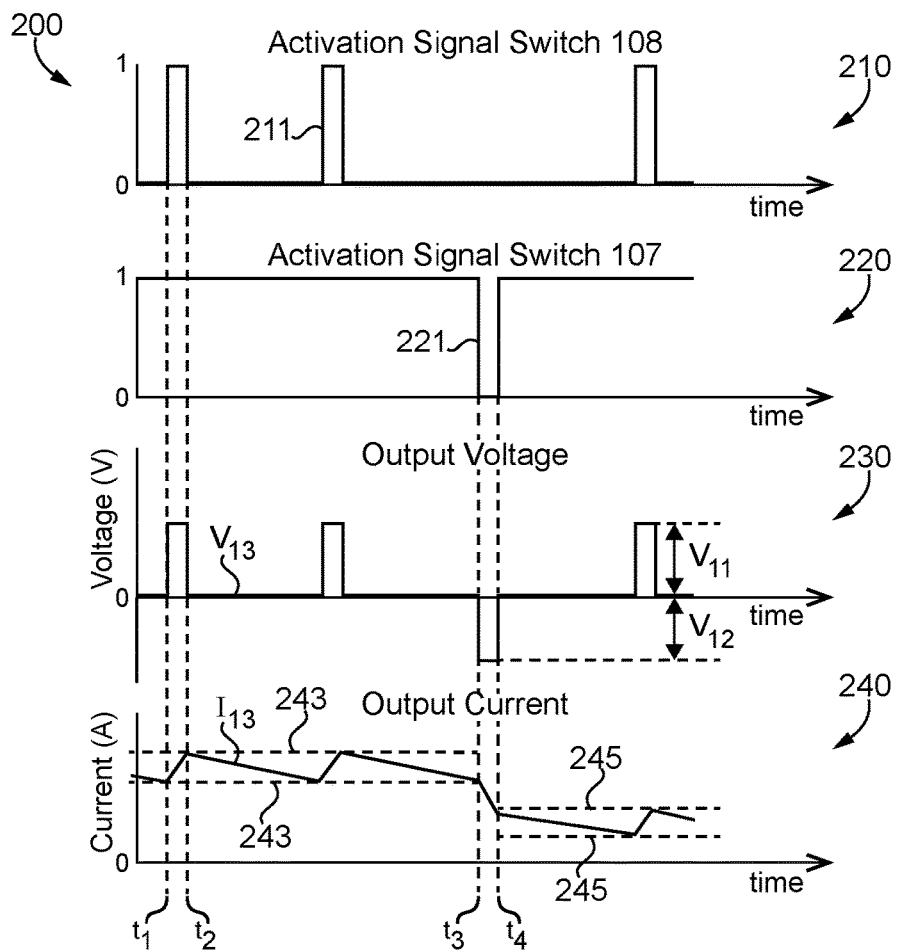
FIG. 2 is a plurality of graphs illustrating electrical characteristics of the exemplary power amplifier in FIG. 1.

With reference to FIG. 2, there is a plurality of graphs 200 illustrating electrical characteristics of power amplifier 101 during operation. Graph 210 illustrates an activation signal 211 sent to semiconductor switch 108 from controller 116. Activation signal 211 includes a low state, corresponding to periods of time when switch 108 is open, and a high state, corresponding to periods of time when switch 108 is closed.

Graph 220 illustrates an activation signal 221 sent to semiconductor switch 107 from controller 116. Activation signal 221 includes a low state, corresponding to periods of time when switch 107 is open, and a high state, corresponding to periods of time when switch 107 is closed.

Graph 230 illustrates voltage $V_{13}$ output by power amplifier 101 as a result of activation signals 211 and 221. Power amplifier 101 outputs a voltage having three levels: a positive value at voltage $V_{11}$, a negative value at voltage $V_{12}$, and 0 V.

Graph 240 illustrates a current 241 output by power amplifier 101 as a result of activation signals 211 and 221. Graph 200 includes a first current range 243 and a second current range 245. The first current range may be based on a first reference signal received by controller 116 and the second current range may be based on a second reference signal received by controller 116.

At time $t_1$, the magnitude of output current 241 falls below or equals the minimum threshold of current range 243. In response, controller 116 closes semiconductor switch 108. As a result, current 241 rises within range 243 and output voltage $V_{13}$ becomes a positive value. At time $t_2$, current 241 exceeds or equals the maximum threshold of current range 243. In certain embodiments, the difference between the minimum and maximum threshold of current range 243 is 5 A. Controller 116 is structured to calculate a current range, such as current range 243 or current range 245, based on parameters of the load coupled to power amplifier 101. In response, controller 116, opens semiconductor switch 108. While switch 108 is open, current 241 decays as a result of power losses in the current loop formed by diode 106, switch 107, winding 112, and sensor 313. At time $t_3$, controller 116 modifies the control strategy for power amplifier 101 based on a changed parameter, current range 245. Current 241 is above the new maximum threshold for current range 245. In response, controller 116 opens semiconductor switch 107. As a result, current 241 decreases and output voltage $V_{13}$ becomes a negative value. At time $t_4$, current 241 is below or equal to the maximum threshold of range 245. In response, controller 116 closes semiconductor switch 107.

As illustrated in FIG. 2, AMB winding 112 is coupled to the positive pole and negative pole of DC power source 115 only when output current $I_{13}$ needs to be corrected, thereby reducing the AC component of the output voltage $V_{13}$ and output current $I_{13}$. During the majority of the operation of power amplifier 101, AMB winding 112 is coupled to neutral point node 103.

Figure 3:
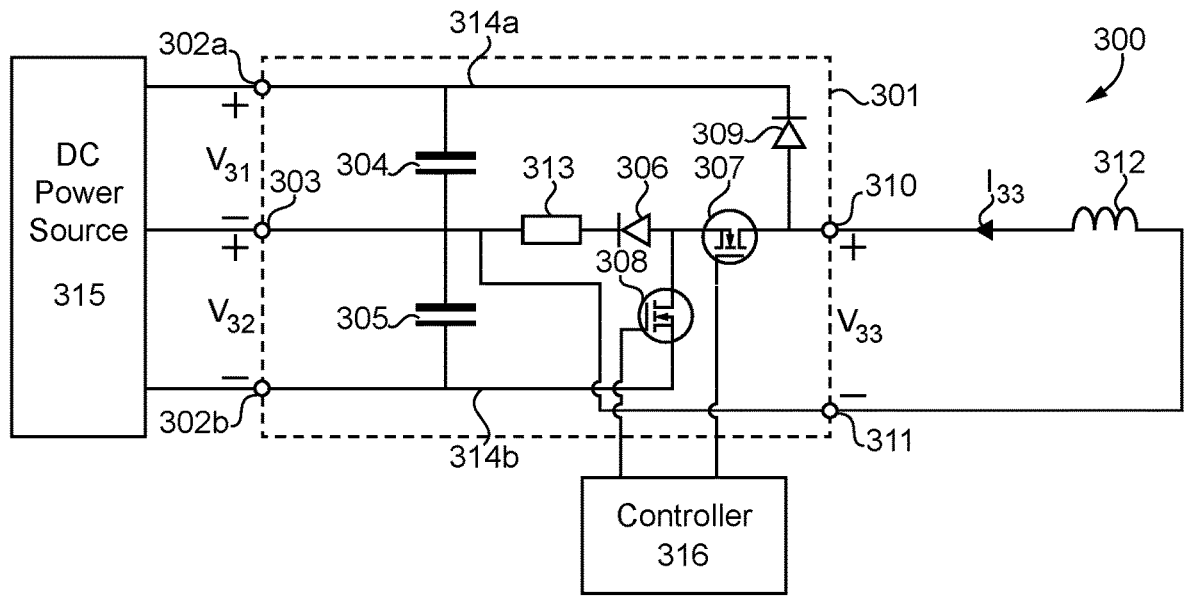
FIG. 3 illustrates another exemplary power amplifier.

With reference to FIG. 3, there is illustrated an exemplary AMB power system 300 including an exemplary power amplifier 301 coupled to a DC power source 315 and an AMB winding 312 DC power source 315 includes a positive pole and a negative pole coupled to power amplifier 301, and is structured to output DC power to power amplifier 301. AMB winding 312 is coupled between output nodes 310 and 311. AMB winding 312 is structured to receive a current $I_{33}$ from power amplifier 301 as current flows from node 311 to node 310. The voltage of the power output by power amplifier 301 between nodes 310 and 311 is output voltage V33.

Power amplifier 301 includes a positive DC bus node 302a, a neutral point node 303, and a negative DC bus node 302b. Positive DC bus node 302a is structured to be coupled to the positive pole of DC power source 315. Negative DC bus node 302b is structured to be coupled to the negative pole of DC power source 315. In certain embodiments, such as the illustrated embodiment, neutral point node 303 may be coupled to a neutral point output node of DC power source 315.

A positive DC bus rail 314a is coupled to positive DC bus node 302a and structured to receive DC power with a positive voltage from DC power source 315. A negative DC bus rail 314b is coupled to negative DC bus node 302b and structured to receive DC power with a negative voltage from DC power source 315.

A capacitor 304 is coupled between positive DC bus node 302a and neutral point node 303, and a capacitor 305 is coupled between neutral point node 303 and negative DC bus node 302b. In certain embodiments, the voltage $V_{31}$ across capacitor 304 and the voltage $V_{32}$ across capacitor 305 are each one half the voltage across DC bus rails 314a and 314b.

Power amplifier 301 includes two semiconductor switches 307 and 308, and two diodes 306 and 309. In other embodiments, diodes 306 and 309 may be replaced with semiconductor switches or another type of device structured to allow unidirectional current flow.

Diode 306 and semiconductor switch 307 are coupled in series between neutral point node 303 and output node 310. Diode 306 is structured to allow current to flow to neutral point node 303 from output node 310, but block current flowing in the opposite direction. Diode 306 includes a first node coupled to neutral point node 303 and a second node coupled to a first node of semiconductor switch 307. Semiconductor switch 307 also includes a second node coupled to output node 310.

Semiconductor switch 308 includes a first node coupled to negative DC bus node 302b by way of DC bus rail 314b and a second node coupled to the second node of diode 306 and the first node of semiconductor switch 307. Diode 309 includes a first node coupled to output node 310 and a second node coupled to positive DC bus node 302a by way of positive DC bus rail 314a. Diode 309 is structured to allow current to flow to positive DC bus node 302a from output node 310, but block current from flowing in the opposite direction.

Neutral point node 303 is coupled to output node 311. In the illustrated embodiment, a sensor 313 is located between neutral point node 303 and the first terminal of diode 306. Sensor 313 is structured to measure electrical characteristics and transmit measurements to controller 316. For example, sensor 313 may measure load current $I_{33}$ by measuring the current flowing between neutral point node 303 and output node 311. Sensor 313 may be a shunt resistor-based measuring device or another type of device structured to measure electrical characteristics. In other embodiments, sensor 313 is operatively coupled between neutral point node 303 and output node 311.

Controller 316 is structured to operate the semiconductor switches of power amplifier 301 so as to control output current $I_{33}$ to winding 312. Beginning where semiconductor switch 307 is closed and 308 is open, controller 316 may increase the magnitude of current $I_{33}$ by closing switch 308 or may decrease the magnitude of current $I_{33}$ by opening switch 307, as explained in more detail below. It shall be appreciated that any or all of the foregoing features of system 300 may also be present in the other power systems disclosed herein.

Figure 4:
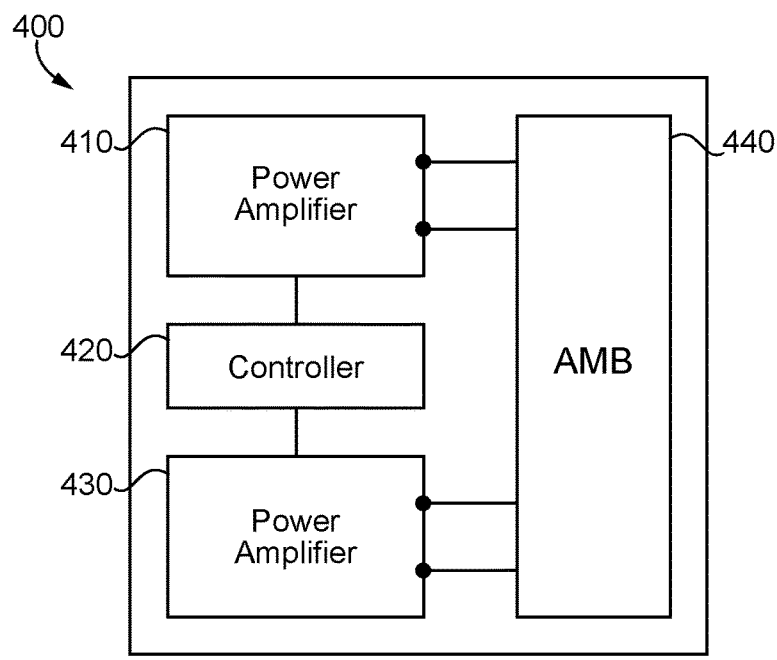
FIG. 4 illustrates an exemplary power system.

With reference to FIG. 4, there is a block diagram illustrating an exemplary power system 400 including an upside power amplifier 410 having the features of power amplifier 101 in FIG. 1, and a downside power amplifier 430 having the features of power amplifier 303 in FIG. 3. Power amplifiers 410 and 430 are coupled to separate windings of an active magnetic bearing 440.

Power system 400 includes a controller 420 structured to synchronously operate the switching devices of power amplifiers 410 and 430. The output voltage pulses generated by power amplifiers 410 and 430 are simultaneous with opposing positive values and negative values, which reduces total capacitive current caused by stray capacitances, as well as high-frequency emission.

Figure 5:
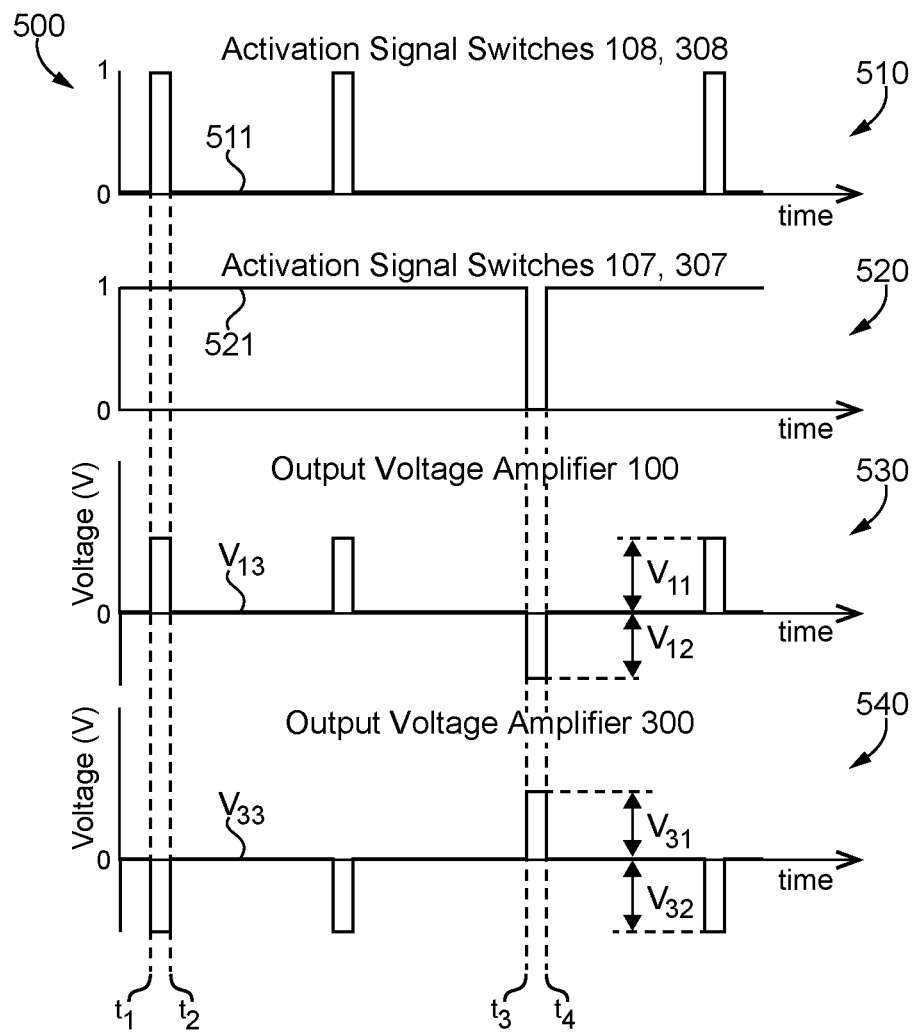
FIG. 5 is a plurality of graphs illustrating electrical characteristics of the exemplary power system in FIG. 4.

With reference to FIG. 5, there is a plurality of graphs 500 illustrating the synchronous operation of power amplifiers 101 and 301 in power system 400 in FIG. 4. Graph 510 illustrates an activation signal 511 sent to semiconductor switches 108 and 308 from controller 420. Activation signal 511 includes a low state, corresponding to periods of time when switches 108 and 308 are open, and a high state, corresponding to periods of time when switches 108 and 308 are closed.

Graph 520 illustrates an activation signal 521 sent to semiconductor switches 107 and 307 from controller 420. Activation signal 521 includes a low state, corresponding to periods of time when switches 107 and 307 are open, and a high state, corresponding to periods of time when switches 107 and 307 are closed.

Graph 530 illustrates voltage $V_{13}$ output by power amplifier 101 as a result of activation signals 511 and 521. Power amplifier 101 outputs a voltage having three levels: voltage $V_{11}$, voltage $V_{12}$, and 0 V.

Graph 540 illustrates a voltage $V_{33}$ output by power amplifier 301 as a result of activation signals 511 and 521. Power amplifier 101 outputs a voltage having three levels: voltage $V_{31}$, voltage $V_{32}$, and 0 V.

At time $t_1$, controller 420 closes switches 108 and 308 using activation signal 511. In response, output voltage $V_{13}$ increases and output voltage $V_{33}$ decreases. At time $t_2$, controller 420 opens switches 108 and 308 using activation signal 511. In response, the magnitudes of output voltages $V_{13}$ and $V_{33}$ become 0 V.

At time $t_3$, controller 420 opens switches 107 and 307 using activation signal 521. In response, output voltage $V_{13}$ decreases and output voltage $V_{33}$ increases. At time $t_4$, controller 420 closes switches 107 and 307 using activation signal 521. In response, the magnitudes of output voltages $V_{13}$ and $V_{33}$ become 0 V.

Further written description of a number of exemplary embodiments shall now be provided. One embodiment is a power system comprising: a power amplifier comprising: a first diode and first semiconductor switch coupled in series between a neutral point node and a first output node, a second output node coupled to the neutral point node, a second diode coupled between the first output node and one of a positive DC bus node and a negative DC bus node, and a second semiconductor switch including a first node coupled to the first diode and first semiconductor switch, and a second node coupled to one of the positive DC bus node and the negative DC bus node; and wherein, the second diode is coupled to one of the positive DC bus node and the negative DC bus node, and the second node of the second semiconductor switch is coupled to the other of the positive DC bus node and the negative DC bus node.

In certain forms of the foregoing power system, the power amplifier comprises a first capacitor coupled between the positive DC bus node and the neutral point node, and a second capacitor coupled between the neutral point node and the negative DC bus node. In certain forms, the second diode is coupled to the positive DC bus node and the second node of the semiconductor switch is coupled to the negative DC bus node. In certain forms, the second diode is coupled to the negative DC bus node and the second node of the semiconductor switch is coupled to the positive DC bus node. In certain forms, the power system comprises a controller structured to operate the first semiconductor switch effective to decrease a magnitude of an output current and the second semiconductor switch effective to increase the magnitude of the output current. In certain forms, the power system comprises a second power amplifier, wherein the controller is structured to operate a third semiconductor switch and a fourth semiconductor switch of the second power amplifier, wherein the controller is structured to operate the first semiconductor switch and the third semiconductor switch synchronously and operate the second semiconductor switch and the fourth semiconductor switch synchronously. In certain forms, the power system comprises a sensor operatively coupled between the second output node and the neutral point node, or operatively coupled between the neutral point node and the first diode. In certain forms, a winding of an active magnetic bearing is coupled between the first output node and the second output node.

Another exemplary embodiment is a power system for an active magnetic bearing comprising: at least one power amplifier comprising: a first semiconductor device including a first node coupled to a neutral point node and a second node, a second output node coupled to the neutral point node, a second semiconductor device including a first node coupled to the second node of the first semiconductor device and a second node coupled to a first output node, a third semiconductor device including a first node coupled to a first DC bus node and a second node coupled to the first output node, and a fourth semiconductor device including a first node coupled to a second DC bus node and a second node coupled to the second node of the first semiconductor device.

In certain forms of the foregoing power system, the first semiconductor device includes a diode, the second semiconductor device includes a semiconductor switch, the third semiconductor device includes a diode, and the fourth semiconductor switch includes a semiconductor switch. In certain forms, the power system comprises a controller structured to operate the second and fourth semiconductor device in response to an output current of the power amplifier being outside a current value range. In certain forms, the power system comprises a DC power source including a positive pole coupled to the first DC bus node and a negative pole coupled to the second DC bus node. In certain forms, the power system comprises a DC power source including a negative pole coupled to the first DC bus node and a positive pole coupled to the second DC bus node. In certain forms, the power system comprises a current sensor structured to measure a load current and output the load current measurement to a power amplifier controller, wherein the load amplifier controller operates the second and fourth semiconductor devices using the measured load current. In certain forms, the power system comprises two power amplifiers and a controller structured to operate the two power amplifiers.

A further exemplary embodiment is a method for controlling an active magnetic bearing comprising: operating a power amplifier coupled to a winding including: a first diode and first semiconductor switch coupled in series between a neutral point node and a first output node, a second output node coupled to the neutral point node, a second diode coupled between the first output node and one of a positive DC bus node and a negative DC bus node, and a second semiconductor switch including a first node coupled to the first diode and first semiconductor switch and a second node coupled to one of the positive DC bus node and the negative DC bus node; and receiving DC power from a DC power source coupled to the positive DC bus node, the negative DC bus node, and the neutral point node; and transmitting an output current to the first output node and the second output node using the first power amplifier.

In certain forms of the foregoing method, the method comprises operating a second power amplifier coupled to a second winding including: a first diode and a first semiconductor switch coupled in series between a neutral point node and a third output node, a second output node coupled to the neutral point node, a second diode coupled between the first output node and a positive DC bus node, and a second semiconductor switch including a first node coupled to the first diode and first semiconductor switch and a second node coupled to the negative DC bus node; wherein the second diode of the first power amplifier is coupled between the first output node of the first power amplifier and the negative DC bus node of the first power amplifier, and wherein the second node of the second semiconductor switch of the first power amplifier is coupled to the positive DC bus node. In certain forms, the method comprises sensing a current flowing between the neutral point node and one of the first diode and the second diode. In certain forms, the method comprises increasing a magnitude of the output current by closing the second semiconductor switch; and decreasing the magnitude of the output current by opening the first semiconductor switch. In certain forms, the method comprises filtering the DC power from the DC power source using a first and second capacitive element.

It is contemplated that the various aspects, features, processes, and operations from the various embodiments may be used in any of the other embodiments unless expressly stated to the contrary. Certain operations illustrated may be implemented by a computer executing a computer program product on a non-transient, computer-readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred," or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include, but do not require, a direct coupling or connection unless expressly indicated to the contrary. When the language "at least a portion" and/or "a portion" is used, the item can include a portion and/or the entire item unless specifically stated to the contrary.

What is claimed is:

1. A power system comprising:
a power amplifier comprising:
a first diode and first semiconductor switch coupled in series between a neutral point node and a first output node,
a second output node coupled to the neutral point node,
a second diode coupled between the first output node and one of a positive DC bus node and a negative DC bus node, and
a second semiconductor switch including a first node coupled to the first diode and first semiconductor switch, and a second node coupled to one of the positive DC bus node and the negative DC bus node; and
wherein the second diode is coupled to one of the positive DC bus node and the negative DC bus node, and the second node of the second semiconductor switch is coupled to the other of the positive DC bus node and the negative DC bus node.

2. The power amplifier of claim 1 comprising a first capacitor coupled between the positive DC bus node and the neutral point node, and a second capacitor coupled between the neutral point node and the negative DC bus node.

3. The power amplifier of claim 1 wherein the second diode is coupled to the positive DC bus node and the second node of the semiconductor switch is coupled to the negative DC bus node.

4. The power amplifier of claim 1 wherein the second diode is coupled to the negative DC bus node and the second node of the semiconductor switch is coupled to the positive DC bus node.

5. The power system of claim 1 comprising a controller structured to operate the first semiconductor switch effective to decrease a magnitude of an output current and the second semiconductor switch effective to increase the magnitude of the output current.

6. The power system of claim 5 comprising a second power amplifier, wherein the controller is structured to operate a third semiconductor switch and a fourth semiconductor switch of the second power amplifier, wherein the controller is structured to operate the first semiconductor switch and the third semiconductor switch synchronously and operate the second semiconductor switch and the fourth semiconductor switch synchronously.

7. The power system of claim 1 comprising a sensor operatively coupled between the second output node and the neutral point node, or operatively coupled between the neutral pair node and the first diode.

8. The power system of claim 1 wherein a winding of an active magnetic bearing is coupled between the first output node and the second output node.

9. A power system for an active magnetic bearing comprising:
at least one power amplifier comprising:
a first semiconductor device including a first node coupled to a neutral point node and a second node,
a second output node coupled to the neutral point node,
a second semiconductor device including a first node coupled to the second node of the first semiconductor device and a second node coupled to a first output node,
a third semiconductor device including a first node coupled to a first DC bus node and a second node coupled to the first output node, and
a fourth semiconductor device including a first node coupled to a second DC bus node and a second node coupled to the second node of the first semiconductor device.

10. The power system of claim 9 wherein the first semiconductor device includes a diode, the second semiconductor device includes a semiconductor switch, the third semiconductor device includes a diode, and the fourth semiconductor switch includes a semiconductor switch.

11. The power system of claim 10 comprising a controller structured to operate the second and fourth semiconductor device in response to an output current of the power amplifier being outside a current value range.

12. The power system of claim 9 comprising a DC power source including a positive pole coupled to the first DC bus node and a negative pole coupled to the second DC bus node.

13. The power system of claim 9 comprising a DC power source including a negative pole coupled to the first DC bus node and a positive pole coupled to the second DC bus node.

14. The power system of claim 9 comprising a current sensor structured to measure a load current and output the load current measurement to a power amplifier controller, wherein the load amplifier controller operates the second and fourth semiconductor devices using the measured load current.

15. The power system of claim 9 comprising two power amplifiers and a controller structured to operate the two power amplifiers.

16. A method for controlling an active magnetic bearing comprising:
operating a power amplifier coupled to a winding including:
a first diode and first semiconductor switch coupled in series between a neutral point node and a first output node,
a second output node coupled to the neutral point node,
a second diode coupled between the first output node and one of a positive DC bus node and a negative DC bus node, and
a second semiconductor switch including a first node coupled to the first diode and first semiconductor switch and a second node coupled to one of the positive DC bus node and the negative DC bus node; and
receiving DC power from a DC power source coupled to the positive DC bus node, the negative DC bus node, and the neutral point node; and
transmitting an output current to the first output node and the second output node using the first power amplifier.

17. The method of claim 16 comprising:
operating a second power amplifier coupled to a second winding including:
a first diode and a first semiconductor switch coupled in series between a neutral point node and a third output node,
a second output node coupled to the neutral point node,
a second diode coupled between the first output node and a positive DC bus node, and
a second semiconductor switch including a first node coupled to the first diode and first semiconductor switch and a second node coupled to the negative DC bus node;
wherein the second diode of the first power amplifier is coupled between the first output node of the first power amplifier and the negative DC bus node of the first power amplifier, and
wherein the second node of the second semiconductor switch of the first power amplifier is coupled to the positive DC bus node.

18. The method of claim 16 comprising:
sensing a current flowing between the neutral point node and one of the first diode and the second diode.

19. The method of claim 16 comprising:
increasing a magnitude of the output current by closing the second semiconductor switch; and
decreasing the magnitude of the output current by opening the first semiconductor switch.

20. The method of claim 16 comprising filtering the DC power from the DC power source using a first and second capacitive element.

* * * * *